(12) United States Patent
Cherkassky

(10) Patent No.: US 12,425,041 B2
(45) Date of Patent: Sep. 23, 2025

(54) INTERPOLATIVE DIVIDER

(71) Applicant: Skyworks Solutions, Inc., Irvine, CA (US)

(72) Inventor: Alexander Cherkassky, Hollis, NH (US)

( * ) Notice: Subject to any disclaimer, the term of this patent is extended or adjusted under 35 U.S.C. 154(b) by 266 days.

(21) Appl. No.: 18/347,433

(22) Filed: Jul. 5, 2023

(65) Prior Publication Data

US 2024/0014826 A1 Jan. 11, 2024

Related U.S. Application Data

(60) Provisional application No. 63/358,604, filed on Jul. 6, 2022.

(51) Int. Cl.
| | |
|---|---|
| *H03M 1/20* | (2006.01) |
| *H03L 7/099* | (2006.01) |
| *H03M 1/06* | (2006.01) |
| *H03L 7/081* | (2006.01) |
| *H03L 7/197* | (2006.01) |

(52) U.S. Cl.
CPC .......... *H03M 1/207* (2013.01); *H03L 7/0992* (2013.01); *H03M 1/0648* (2013.01); *H03L 7/0814* (2013.01); *H03L 7/1974* (2013.01)

(58) Field of Classification Search
CPC ... H03M 1/207; H03M 1/0648; H03L 7/0992; H03L 7/0814; H03L 7/1974
See application file for complete search history.

(56) References Cited

U.S. PATENT DOCUMENTS

| | | |
|---|---|---|
| 7,417,510 B2 | 8/2008 | Huang |
| 7,800,451 B2 | 9/2010 | Fu et al. |
| 7,839,225 B2 | 11/2010 | Huang |
| 8,193,867 B2 | 6/2012 | Fu et al. |
| 8,248,175 B2 | 8/2012 | Hara |
| 8,441,291 B2 | 5/2013 | Hara et al. |
| 8,514,118 B2 | 8/2013 | Eldredge |
| 8,531,246 B2 | 9/2013 | Huang |
| 8,786,341 B1 | 7/2014 | Weltin-wu et al. |
| 8,791,734 B1 | 7/2014 | Hara et al. |
| 8,928,820 B2 | 1/2015 | Coban et al. |
| 8,994,420 B2 | 3/2015 | Eldredge et al. |
| 10,461,964 B1 | 10/2019 | Cherkassky et al. |
| 10,483,987 B1 | 11/2019 | Ranganathan et al. |
| 10,511,312 B1 | 12/2019 | Pastorello et al. |

(Continued)

*Primary Examiner* — Joseph J Lauture
(74) *Attorney, Agent, or Firm* — Knobbe, Martens, Olson & Bear, LLP

(57) ABSTRACT

An interpolative divider divides an input clock signal according to a divide ratio and supplies an output clock signal. An integer divider receives the input clock signal and supplies an integer divider output signal. A phase interpolator is coupled to the integer divider and delays the integer divider output signal according to a quantization error. The phase interpolator includes first and second current sources. The first current source turns on k unit current elements during a first part of a charging cycle to charge a first capacitor to a first voltage, $0 \leq k \leq M$, k and M are integers, and k is determined by the digital quantization error. The second current source turns on k+M unit elements to charge a second capacitor during a second part of the charging cycle. The output clock signal transitions when the first voltage equals the second voltage.

20 Claims, 8 Drawing Sheets

(56) References Cited

U.S. PATENT DOCUMENTS

| | | |
|---|---|---|
| 10,511,315 B1 | 12/2019 | Sarda |
| 10,608,647 B1 | 3/2020 | Ranganathan et al. |
| 10,608,649 B1 | 3/2020 | Jayakumar et al. |
| 10,637,483 B2 | 4/2020 | Caffee et al. |
| 10,819,353 B1 | 10/2020 | Monk et al. |
| 10,833,682 B1 | 11/2020 | Monk et al. |
| 11,283,459 B1 | 3/2022 | Monk et al. |
| 11,290,250 B2 | 3/2022 | Sarda |
| 11,563,441 B2 | 1/2023 | Monk et al. |
| 11,777,703 B2 | 10/2023 | Sarda |
| 11,888,493 B2 | 1/2024 | Monk et al. |
| 2018/0131378 A1* | 5/2018 | Haroun .................... H03L 7/16 |
| 2023/0094645 A1 | 3/2023 | Jayakumar |
| 2023/0198531 A1 | 6/2023 | Jayakumar |
| 2024/0014826 A1 | 1/2024 | Cherkassky |
| 2024/0297656 A1 | 9/2024 | Gong et al. |

\* cited by examiner

INTERPOLATIVE DIVIDER

BACKGROUND

This disclosure relates to interpolative dividers and more particularly to interpolative dividers with a differential phase interpolator.

Interpolative dividers have been used to provide multiple clock signals unrelated in frequency and phase based on a single reference clock source such as a single phase-locked loop.

SUMMARY

In some aspects an embodiment is provided of an interpolative divider that divides an input clock signal and supplies an output clock signal. A phase interpolator is coupled to the integer divider and supplies a delayed divided clock signal as the output clock signal. The phase interpolator includes a first current source coupled to a first capacitor. The phase interpolator further includes a second current source coupled to a second capacitor and the phase interpolator includes a comparator coupled to the first capacitor and the second capacitor to compare a first voltage across the first capacitor and a second voltage across the second capacitor.

In some aspects, the techniques described herein relate to an interpolative divider wherein a transition of the output clock signal is determined responsive to the comparator indicating that the first voltage equals the second voltage.

In some aspects, the techniques described herein relate to an interpolative divider further including a divider controller coupled to provide an integer divider control signal to the integer divider and a digital quantization error to a phase interpolator that includes the first current source, the second current source, the first capacitor, the second capacitor, and the comparator.

In some aspects, the techniques described herein relate to an interpolative divider wherein the integer divider is a multi-modulus divider.

In some aspects, the techniques described herein relate to an interpolative divider wherein the divider controller includes a sigma delta modulator.

In some aspects, the techniques described herein relate to an interpolative divider wherein the sigma delta modulator receives an interpolative divider divide value to cause the interpolative divider to divide the input clock signal by the interpolative divider divide value.

In some aspects, the techniques described herein relate to an interpolative divider wherein the first current source includes 2M unit elements, and k unit elements of the first current source are turned on during a first part of a charging cycle, where M is an integer and k is an integer less than or equal to M and greater than or equal to zero.

In some aspects, the techniques described herein relate to an interpolative divider wherein during one charging cycle the first current source is coupled to the first capacitor and the second current source is coupled to the second capacitor and during another charging cycle the first current source is coupled to the second capacitor and the second current source is coupled to the first capacitor.

In some aspects, the techniques described herein relate to an interpolative divider wherein the second current source includes 2M unit elements and (k+M) unit elements are turned on during a second part of a charging cycle.

In some aspects, the techniques described herein relate to an interpolative divider wherein the k unit elements of the first current source remain on during the second part of the charging cycle.

In some aspects, the techniques described herein relate to an interpolative divider wherein a value of k is determined according to the digital quantization error.

In some aspects, the techniques described herein relate to an interpolative divider wherein first part of the charging cycle lasts one period of the input clock signal.

In some aspects, the techniques described herein relate to an interpolative divider wherein the second part of the charging, cycle lasts until the first voltage on the first capacitor equals the second voltage on the second capacitor.

In some aspects, the techniques described herein relate to an interpolative divider further including: a first reset circuit coupled to reset the first voltage across the first capacitor to a reset voltage; and a second reset circuit coupled to reset the second voltage across the second capacitor to the reset voltage.

In some aspects, the techniques described herein relate to an interpolative divider where the first reset circuit and the second reset circuit reset the first voltage and the second voltage, respectively, after the second part of the charging cycle.

In some aspects, the techniques described herein relate to an interpolative divider wherein the reset voltage is a ground voltage.

According to additional aspects an apparatus is provided for generating clock signals includes an interpolative divider that provides an output clock signal. The interpolative divider includes an integer divider coupled to receive an input clock signal and a phase interpolator coupled to the integer divider. The phase interpolator includes a first current source coupled to a first capacitor, a second current source coupled to a second capacitor, and a comparator coupled to the first capacitor and the second capacitor. An input clock source supplies the input clock signal to the interpolative divider.

In some aspects, the techniques described herein relate to an apparatus wherein the input clock source is a phase-locked loop.

In some aspects, the techniques described herein relate to an apparatus further including a crystal oscillator supplying a reference clock signal to the phase-locked loop.

In some aspects, the techniques described herein relate to an apparatus wherein the interpolative divider further includes a divider controller coupled to provide an integer divide control signal to the integer divider and to provide a digital quantization error to the phase interpolator.

In some aspects, the techniques described herein relate to an apparatus wherein the integer divider is a multi-modulus divider.

In some aspects, the techniques described herein relate to an apparatus wherein the divider controller includes a sigma delta modulator.

In some aspects, the techniques described herein relate to an apparatus wherein the sigma delta modulator receives a divide value to cause the interpolative divider to divide the input clock signal by the divide value.

In some aspects, the techniques described herein relate to an apparatus wherein the first current source includes M unit elements, and k unit elements of the first current source are turned on during a first portion of a charging cycle, where k and M are integers and $0 \leq k \leq M$.

In some aspects, the techniques described herein relate to an apparatus wherein the second current source includes 2M unit elements and (k+M) unit elements are turned on during a second portion of a charging cycle.

In some aspects, the techniques described herein relate to an apparatus wherein the k unit elements of the first current source remain on during a second portion of the charging cycle.

In some aspects, the techniques described herein relate to an apparatus wherein a value of k is determined according to the digital quantization error.

In some aspects, the techniques described herein relate to an apparatus wherein first portion of the charging cycle lasts one period of the input clock signal.

In some aspects, the techniques described herein relate to an apparatus wherein the first portion of the charging cycle begins with a transition of the input clock signal.

In some aspects, the techniques described herein relate to an apparatus wherein the second portion of the charging cycle lasts until a first voltage on the first capacitor equals a second voltage on the second capacitor.

In some aspects, the techniques described herein relate to an apparatus wherein a transition of the output clock signal is determined responsive to the comparator indicating that the first voltage equals the second voltage.

In some aspects, the techniques described herein relate to an apparatus further including: a first reset circuit coupled to reset the first voltage across the first capacitor to a reset voltage; and a second reset circuit coupled to reset the second voltage across the second capacitor to the reset voltage.

In some aspects, the techniques described herein relate to an apparatus where the first reset circuit and the second reset circuit reset the first voltage and the second voltage, respectively, after the second portion of the charging cycle ends.

In some aspects, the techniques described herein relate to an apparatus wherein the reset voltage is a ground voltage.

In some aspects, the techniques described herein relate to an apparatus further including at least one additional interpolative divider coupled to the input clock signal and supplying an additional output clock signal, the additional output clock signal having a frequency independent of the output clock signal of the interpolative divider.

According to further embodiments a method is provided for generating an output clock signal includes receiving an input clock signal at an interpolative divider. The interpolative divider divides the input clock signal in an integer divider according to an integer divider control signal and an output of the integer divider is supplied to a phase interpolator. A first capacitor in the phase interpolator is charged using a first current source during a first part of a charging cycle and during a second part of the charging cycle. A second capacitor in the phase interpolator is charged using a second current source during a second part of a charging cycle but not the first part of the charging cycle. A transition in the output clock signal is generated responsive to a first voltage across the first capacitor and a second voltage across the second capacitor being equal.

In some aspects, the techniques described herein relate to a method further including supplying the input clock signal from a phase-locked loop.

In some aspects, the techniques described herein relate to a method further including supplying a reference clock signal to the phase-locked loop from a crystal oscillator.

In some aspects, the techniques described herein relate to a method further including supplying an integer divide control signal to the integer divider and a digital quantization error to the phase interpolator from a sigma delta modulator.

In some aspects, the techniques described herein relate to a method further including supplying an interpolative divider divide ratio to the sigma delta modulator to cause the interpolative divider to divide the input clock signal by the interpolative divider divide ratio.

In some aspects, the techniques described herein relate to a method further including charging the first capacitor with k of M unit elements of the first current source during the first part of the charging cycle and the second part of the charging cycle, where M and k are integers and $0 \leq k \leq M$.

In some aspects, the techniques described herein relate to a method further including charging the second capacitor with (k+M) unit elements turned on in the second current source during the second part of the charging cycle.

In some aspects, the techniques described herein relate to a method determining a value of k according to the digital quantization error.

In some aspects, the techniques described herein relate to a method further including: charging the first capacitor using the first current source and charging the second capacitor with the second current source during a first charging cycle; and charging the first capacitor using the second current source and charging the second capacitor with the first current source during a next charging cycle.

In some aspects, the techniques described herein relate to a method wherein the first part of the changing cycle lasts one period of the input dock signal.

In some aspects, the techniques described herein relate to a method further including ending the second part of the charging cycle when the first voltage on the first capacitor equals the second voltage on the second capacitor.

In some aspects, the techniques described herein relate to a method further including resetting the first voltage across the first capacitor and the second voltage across the second capacitor to a reset voltage after the second part of the charging cycle.

In some aspects, the techniques described herein relate to a method wherein the reset voltage is a ground voltage.

In some aspects, the techniques described herein relate to a method further including: supplying the input clock signal to at least one additional interpolative divider; and supplying an additional output clock signal from the at least one additional interpolative divider with a frequency independent from a frequency of the output clock signal.

In some aspects, the techniques described herein relate to a system utilizing a plurality of clock signals including: a first interpolative divider to divide an input clock signal by a first divide ratio, the first interpolative divider including a first integer divider coupled to the input clock signal, the first interpolative divider including a first phase interpolator coupled to the first integer divider to provide a first output clock signal, the first phase interpolator including a first current source coupled to a first capacitor, a second current source coupled to a second capacitor, and a first comparator coupled to the first capacitor and the second capacitor; a second interpolative divider to divide the input clock signal by a second divide ratio, independent of the first divide ratio, the second interpolative divider including a second integer divider coupled to the input clock signal, the second interpolative divider including a second phase interpolator coupled to the second integer divider to provide a second output clock signal, the second phase interpolator including a third current source coupled to a third capacitor, a fourth current source coupled to a fourth capacitor, and a second comparator coupled to the first capacitor and the second capacitor; and a phase-locked loop to supply toe input clock signal.

In some aspects, the techniques described herein relate to a system further including a crystal oscillator supplying a reference clock signal to the phase-locked loop.

In some aspects, the techniques described herein relate to a system including a first portion utilizing the first output clock signal and a second portion utilizing the second output clock signal and frequencies of the first output clock signal and the second output clock signal are unrelated.

In some aspects, the techniques described herein relate to a system wherein the first current source includes M unit elements, and k unit elements of the first current source are turned on during a first portion of a charging cycle, where k and M are integers and 0≤k≤M.

In some aspects, the techniques described herein relate to a system wherein the second current source includes 2M unit elements and (k+M) unit elements are turned on during a second portion of a charging cycle.

In some aspects, the techniques described herein relate to a system wherein the k unit elements of the first current source remain on during a second portion of the charging cycle.

In some aspects, the techniques described herein relate to a system wherein a value of k is determined according to a digital quantization error.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Interpolative dividers (ID) are used in high performance timing applications to generate multiple unrelated frequencies from a single high precision phase-locked loop (PLL) as opposed to using multiple PLLs. Essentially, an interpolative divider cleanly divides the PLL output by a fractional number by changing the phase of the PLL output by a fraction of its period on each interpolative divider transition. Certain interpolative divider designs are quite sensitive to power supply noise and stray signal coupling and thus require a very large amount of decoupling capacitance in order to achieve low jitter and spur performance thus negating its advantage over separate PLLs and making IDs relatively area expensive. It should be noted that decoupling capacitance does not scale with future technology feature size reduction while die area is increasingly expensive.

The interpolative divider topology described herein uses a differential structure with high levels of active power supply rejection and coupling rejection in order to greatly decrease decoupling area requirements for a given jitter and spur performance. That allows the use of many more interpolative dividers on increasingly costly die since the decoupling area can be significantly reduced or improved performance by using the same decoupling area and obtaining improved jitter and spur performance. Embodiments employ a highly symmetric differential architecture to greatly reduce overall area requirements and improve jitter and spur performance by reducing passive decoupling capacitance.

Figure 1:
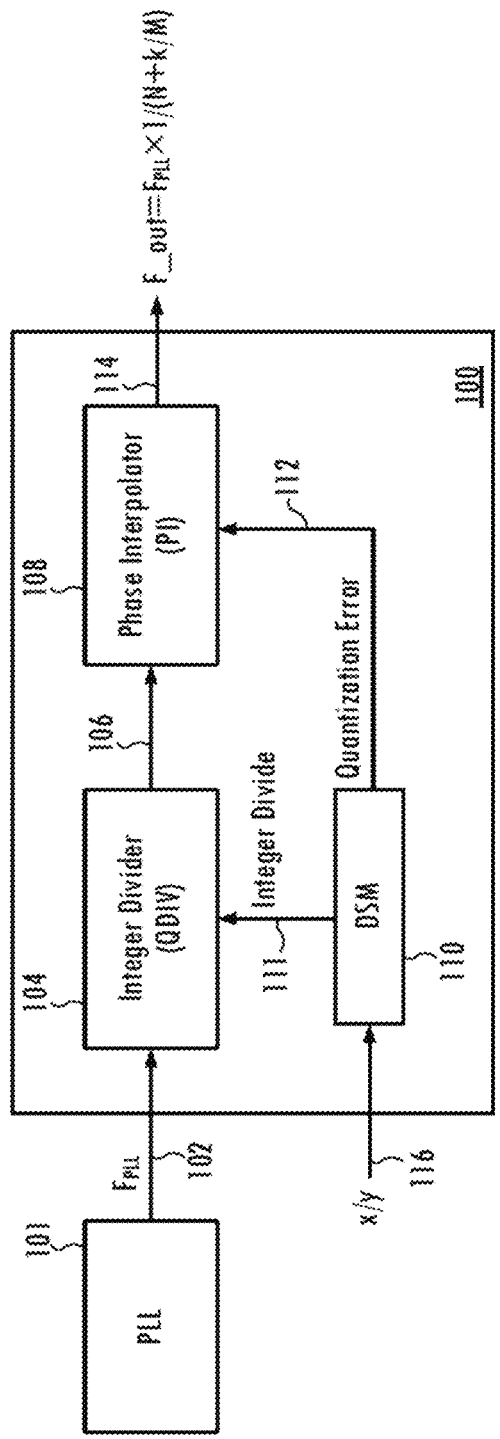
FIG. 1 illustrates a high level block diagram of an interpolative divider.

FIG. 1 illustrates a high level block diagram of an interpolative divider 100. The phase-locked loop (PLL) 101 supplies a PLL output signal 102 having a frequency of $F_{PLL}$ to a multi-modulus integer divider (QDIV) 104, which divides the PLL output signal 102 by an integer number N and supplies an integer divider (QDIV) output signal 106 to the phase interpolator (PI) 108. In embodiments a delta sigma modulator (DSM) 110 supplies the integer divide value N 111 to the integer divider 104 and a quantization error 112 to the phase interpolator 108. The DSM 110 receives a divide value (x/y) 116 where x and y are integers or in some embodiments can be real numbers. The phase interpolator 108 shifts the output phase of the QDIV output signal 106 by a fraction of a PLL cycle on each QDIV active edge, e.g., each rising edge or falling edge.

Figure 2:
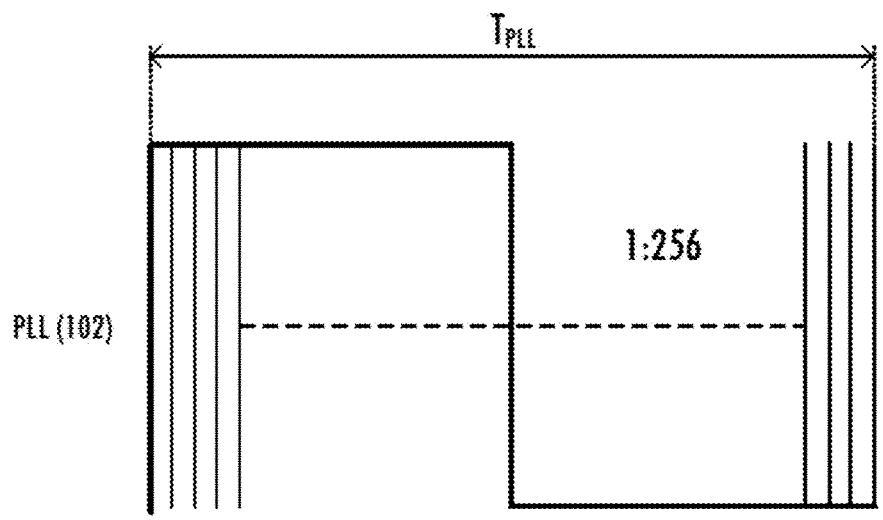
FIG. 2 illustrates graphically the operation of a phase interpolator portion of an interpolative divider.

FIG. 2 illustrates graphically the operation of the phase interpolator. FIG. 2 shows the PLL output signal 102 of the PLL has a period $T_{PLL}$. The phase interpolator divides the period of the PLL output signal into 256 separate time slices. Other embodiments use other numbers of time slices. The PI 108 adjusts the integer divider (QDIV) output signal 106 by a number of time slices based on the value of the quantization error. The phase interpolator functions as a programmable delay cell that resolves the period of the PLL output signal into k equally spaced steps=$T_{PLL}/k$. In an embodiment, the output signal is an output signal of a voltage controlled oscillator (VCO) of the PLL.

Figure 3:
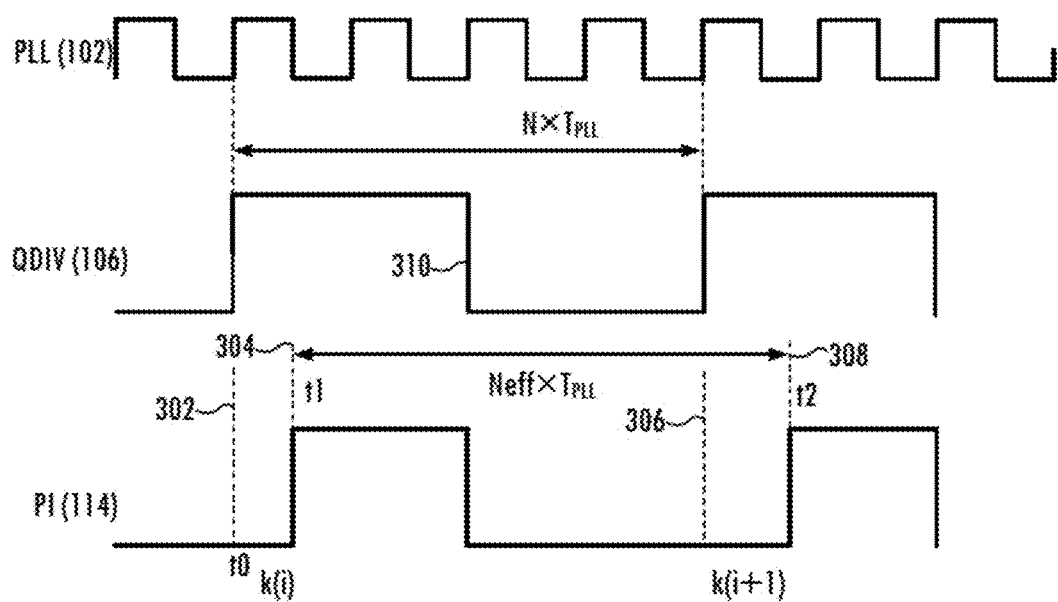
FIG. 3 illustrates timing waveforms associated with operation of the interpolative divider.

FIG. 3 provides a simple example of the operation of the interpolative divider. FIG. 3 shows the PLL output signal 102 and the QDIV output signal 106. The integer divider divides the PLL output by N. In FIG. 3, N is 4 and the rising edge of QDIV output signal 106 is at 302. The phase interpolator delays the rising edge so the rising edge occurs at t1 (304) instead of at 302 and the next rising edge to occur at t2 (308) instead of 306. The delay cell output period=$N*T_{PLL}+T_{PLL}*\Delta k/M=T_{PLL}*(N+\Delta k/M)=T_{PLL}*Neff$ where $\Delta k$ is the PI update step. $\Delta k$ is further defined herein. The period of the interpolative divider output signal is Neff×$T_{PLL}$, where Neff is the change in the divider value N based on the quantization error. For example, if the divide value x/y were 4.25 (17/4), the integer divider would receive sequential values of the divide control signal such that the average output of the integer divider was a divide by 4.25. The digital quantization error represents the difference between the output of QDIV and the output if the divide was accurate for the divide ratio rather than just the integer portion of the divide ratio.

Still referring to FIG. 3, the QDIV output signal 106 with a frequency of $F_{PLL}/N$ clocks the delay cell, where N is the integer divide value 111. Referenced to t=0=zero crossing of integer divider output at 302, and t1 and t2 are consecutive rising edges (zero crossings) of the output of the delay cell:

$$t1 = T_{PLL} \times k[1]/M,$$

where k[1] is a first number of time slices and M is the total number of time slices, e.g., 256, and k[1]/M corresponds to 1.

$t2 = N \times T_{PLL} \pm T_{PLL} \times k[2]/M$, where k[2] is a second number of time slices and k[2]/M corresponds to the distance between 306 and 308.

The period Tout of the output signal of the delay cell is $$\text{Tout} = t2 - t1 = N \times T_{PLL} + \Delta k/M \times T_{PLL} = T_{PLL} \times \text{Neff} = T_{PLL} \times N \times (1 + \Delta k/NM), \text{ where } \Delta k = k[2] - k[1], \text{ Where Neff is the effective divide value.}$$

The frequency of the output of the phase interpolator $F\_PI = F_{PLL}/\text{Neff} = \text{Fint} \times N/\text{Neff}$, where Fint is the frequency of the QDIV output signal 106 (FIG. 1). Thus, the interpolative divider 100 divides the PLL output 102 by a fractional number x/y such that $\text{Fout} = F_{PLL} \times 1/(N + \Delta k/M)$.

Thus, the PLL clock signal 102 can be divided by any divide value by the interpolator divider 100 and the quantization error can be reduced to 1/M of the period of the PLL output signal. For example, if the PLL 101 supplies a clock signal with a frequency of 1 GHz, and M=256, the interpolative divider reduces the quantization error to 3.9 femtoseconds (1 ps/256).

Figure 4:
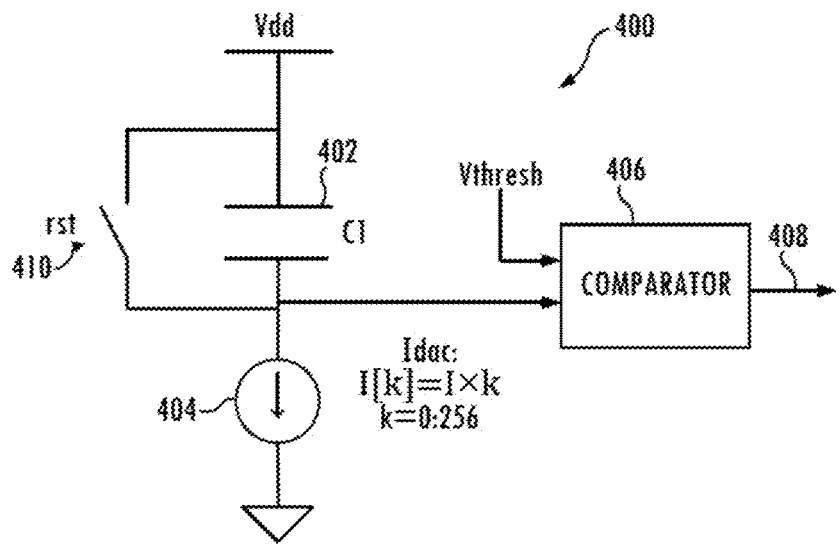
FIG. 4 illustrates the topology of a single ended phase interpolator.

FIG. 4 illustrates the topology of a single ended phase interpolator 400. Phase interpolator 400 includes a delay cell with the delay determined by the quantization error. The delay cell 400 includes the capacitor C1 402 and variable current source 404. The capacitor 402 charges up to the voltage Vdd. The current source 404 discharges the capacitor to a predetermined threshold Vth on each rising edge (or falling edge) transition of QDIV output signal 106 (see FIG. 1). When the capacitor voltage discharges to Vth the comparator 406 triggers causing the comparator output 408 to transition resulting in the PI output 114 (see FIG. 1) transitioning, e.g., to a rising edge at 304 as shown in FIG. 3, thus achieving a phase shift determined by the rate of discharge. Note that there may be additional logic between the comparator output 408 and the PI output 114, e.g., to provide the falling edge 310 shown in FIG. 3 and adjust the duty cycle if desired. By varying current source strength on each QDIV rising or falling edge transition, a controlled change in PI output frequency is achieved. After the comparator triggers, the reset switch 410 closes to recharge the capacitor to the predetermined voltage (here Vdd).

The current source 404 is formed, e.g., by M individual current elements k, where M is, e.g., 256. The number of current elements turned on determines the current strength ($I \times k$) and therefore how fast the discharge occurs, where I is the current from one unit element.

Figure 5:
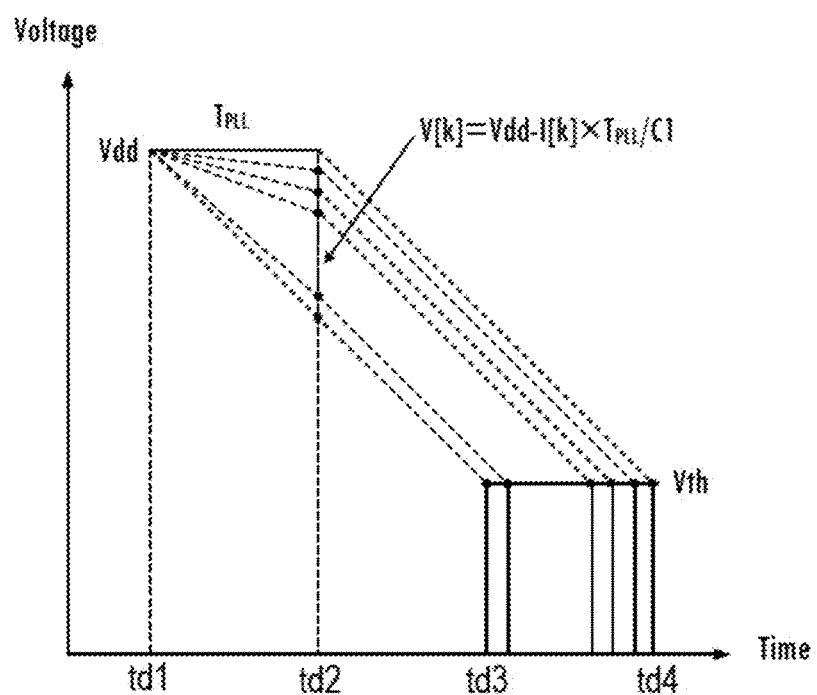
FIG. 5 illustrates an embodiment in which discharging the capacitor has two parts.

The delay cell approach shown in FIG. 4 uses a current digital to analog (MAO 404 as the variable current source to discharge the capacitor C1 402. FIG. 5 illustrates an approach to discharging the capacitor in which the discharge has two parts. The first part discharges the capacitor 402 for one $T_{PLL}$ period starting at td1 and ending at td2 with k current elements turned on. With a unit current element of I, the discharge current is (IA). The k current elements correspond to the quantization error. The first discharge part is the interpolation part. At td2 the voltage supplied to the comparator $v[k] = \text{Vdd} - I[k] \times T_{PLL}/C1$. The second part of the discharge cycle starts at td2 and ends when the voltage on the capacitor 402 discharges to the threshold voltage Vth between td3 and td4. The discharge rate during the second part of the discharge cycle is constant with all unit elements, e.g., 256 unit element in MAC 404, turned on. The total delay from the rising edge of the integer divider output depends on the quantization error. When the voltage on C1 crosses the comparator threshold Vth during the second part of the discharge cycle, comparator 406 triggers and generates an edge of the PI output clock signal and the second part of the discharge cycle ends. Since the slope of the discharge during the second part is constant, the time that the voltage on C1 reaches the threshold voltage depends on the interpolation occurring in the first part of the discharge cycle. Thus, the final voltage on C1, $V_{final} = \text{Vth} = \text{Vdd} - I \times k \times T_{PLL}/C1 - 256 \times I \times T2/C1$ where T2 is the time to reach the comparator voltage threshold in segment 2 and Vth is the comparator threshold. Thus $T2 = (\text{Vdd} - \text{Vth}) \times C1/256I - T_{PLL} \times k/256$ and referenced to the beginning of interpolation cycle (zero crossing of integer divider output at t1) the delay cell output $T[k] = T_{PLL} + T2[k]$ and the frequency of the ID output signal $F\_PI = F_{PLL}/\text{Neff} = \text{Fint} \times N/\text{Neff}$ where N is integer divider setting and $\text{Neff} = N \times (1 + \Delta k/256N) = N + \Delta k/256$. Note that due to the fixed discharge time between td1 and td2 in embodiments the ID output is always delayed by a minimum of one $T_{PLL}$ period to allow for that time. Thus, referring to FIG. 3, in embodiments the time between t1 and t2 also includes one PLL period. In other embodiments, the time between te11 and td2 starts one PLL cycle before QDIV transitions. Typically, the period of the PLL is the VCO period. A period of VCO delay can be absorbed into the integer divide N since N is known, and so the interpolation can be started at an earlier VCO cycle, e.g., cycle N−1. Thus, if the integer divide value supplied to the QDIV is 4, the discharge cycle starts after three VCO cycles.

One problem with the topology shown in FIG. 4 is the single-ended operation. Noise or spikes on the supply voltage VDD appear directly on the opposite node of capacitor C1 and thus are present on the input to the comparator. The same shortcoming applies to stray coupling. Thus, a very large amount of power supply decoupling capacitance is used in such a design to achieve desired jitter and spur performance. The decoupling capacitance area can be many times greater in area than the actual ID active area. For example, the active area may be only 10 percent or less of the area required by the interpolative divider given the required size of the decoupling capacitance.

Figure 6:
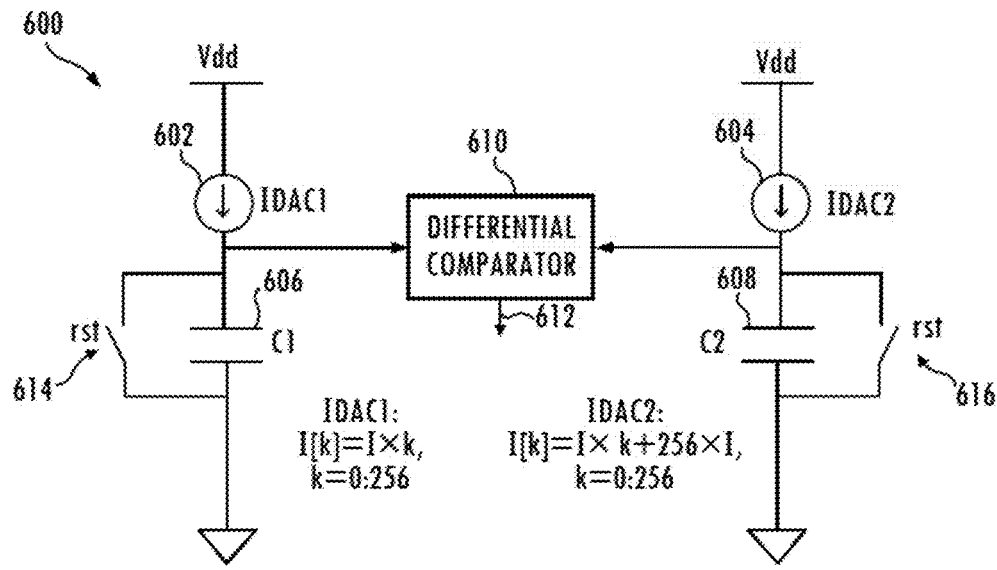
FIG. 6 illustrates an embodiment for a phase interpolator using a differential topology.

FIG. 6 illustrates an embodiment for a phase interpolator using a differential topology that reduces the need for decoupling capacitance as compared to the single ended approach shown in FIG. 4. The phase interpolator 600 shown in FIG. 6 uses two current DACs IDAC1 602 and IDAC2 604. Each IDAC has 2M unit elements, where M is an integer, e.g., M=256. The phase interpolator 600 further includes two charging capacitors C1 606 and C2 608. Here the capacitors C1 and C2 are identical and are charged by respective current sources IDAC1 and IDAC2 each composed of 2M unit elements of which each of at least M unit elements can be individually turned ON/OFF. The number of elements that are turned on ranges from k IDAC1 to k+M in IDAC2, where k can range from 0 to M. Note that in some embodiments. 2M units are individually controllable in each IDAC and in other embodiments M units are individually controllable another M units are controllable as one or more groups of elements.

The charging process occurs in two parts. In part 1 k units of the current source I1 are turned on thus IDAC1 602 charges capacitor C1 with a current equal to k×I, where I is the current from each unit element. The first part of the charging cycle lasts for on PLL period ($T_{PLL}$). In part 2 of the charging cycle, starting 1 PLL clock cycle later at t1, the current source IDAC2 with k+M current elements turned on, charges capacitor C2 at a higher rate (I×k+I×M) due to the extra M current elements being enabled. At time t2=$T_{PLL}$+ dT the voltage on the two capacitors C1 and C2 are equal at which point the fully differential comparator 610 triggers and the output of the interpolative divider transitions from low to high (or high to low). The output of the comparator 612 is supplied to logic that combines the output of the differential comparator 612 with the QDIV clock signal to generate, e.g., the clock signal PI 114 shown in FIG. 3. That is the rising, edge of QDIV is delayed until the differential comparator triggers but the falling edge remains the same. Note that additional logic may be used to adjust the duty cycle of the output of the PI to a desired duty cycle, e.g., 50%.

Figure 7:
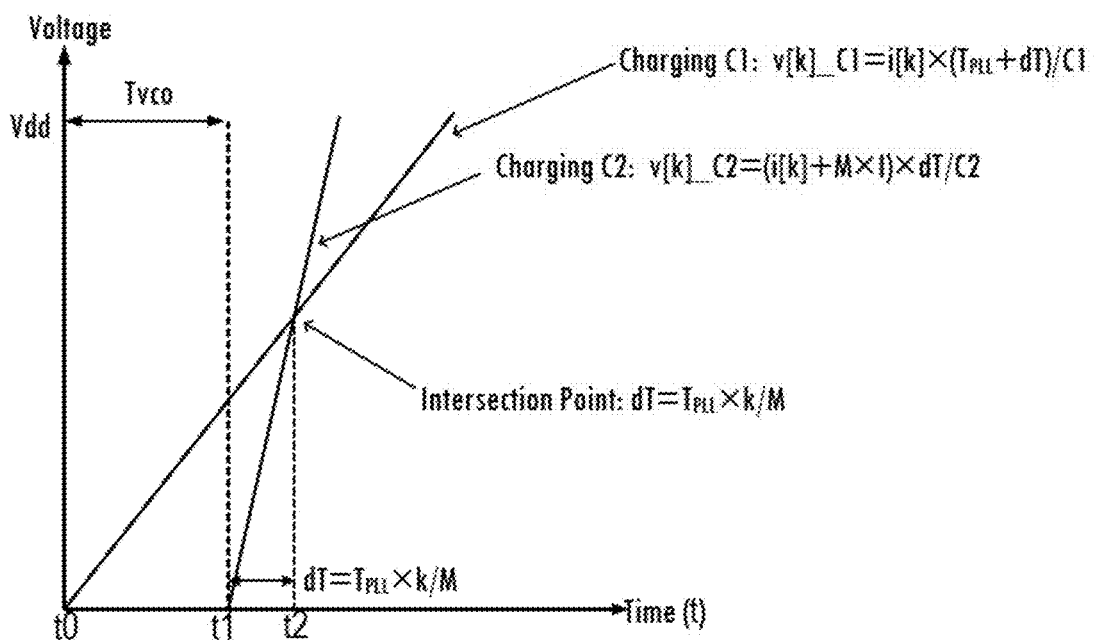
FIG. 7 illustrates a two part charging cycle associated with an embodiment of the phase interpolator with a differential topology.

FIG. 7 illustrates the two parts of the charging cycle. With reference to FIG. 6 and FIG. 7, in part 1 of the charging cycle, IDAC1 602 starts charging C1 with k unit elements providing a current of I×k beginning at t=0, where I is the unit element current. The voltage v[k] on C1 is v[k]=I[k]× t/C1 where t is the time following start of the charging cycle at to. Part 1 of the charging cycle lasts exactly one PLL clock cycle ($T_{PLL}$) until t1. Part 2 of the charging cycle starts at t1. During part 2 of the charging cycle, C1 continues to charge as before with k current sources turned (v[k]=I[k]×t/C1). IDAC2 has (k+M) unit elements enabled and charges C2 during part 2 of the charging cycle starting at t1. The rate of charge of C2 is higher than that of C1 by M×I/C (assuming C1=C2). When the voltage on C2 crosses the voltage on C1, differential comparator 610 triggers and the differential comparator generates a PI output edge. The comparator 610 triggers when V(C1)=V(C2).

V(C1)=k×I/C1×($T_{PLL}$+dT), where dT is the time measured after t1. V(C2)=(M+k)×I/C2×dT and thus dT is obtained as dT=$T_{PLL}$×k/M and as previously stated, F_PI=Fvco/Neff=Fint×N/Neff where N is integer divider setting and Neff=N×(1+Δk/256N)=N+Δk/256. The delay from the integer divider QDIV output signal 106 (see FIGS. 1 and 3) to the output of the phase interpolator equals $T_{PLL}$+dT=$T_{PLL}$×(1+k/M) where k ranges from 0 to M.

Once the differential comparator 610 triggers, the reset switches 614 and 616 close responsive, e.g., to a falling edge of the QDIV output signal 106 to discharge the capacitors C1 606 and C2 608 to prepare for the next charging cycle. The next charging cycle occurs at the next rising edge of the QDIV output signal 106. The comparator output is ignored or the comparator is disabled except during the charging cycle so that resetting the voltage on the capacitors to 0 volts (or other predetermined voltage) does cause the comparator trigger resulting in a transition of the ID output clock signal.

In embodiments the phase interpolator shown in FIG. 6 is symmetric with an equal number of identical current elements in IDAC1 602 and IDAC2 604 and identical capacitors C1 606 and C2 608. In other embodiments, IDAC1 has only M unit elements and IDAC2 has 2M unit elements. Of course "identical" for the capacitors and current elements is limited by typical semiconductor processing limitations and process voltage and temperature (PVT) variations that may be present in the integrated circuit in which the phase interpolator is disposed. Assuming a symmetric structure of the phase interpolator, i.e., an equal number of identical unit elements in each IDAC and identical capacitors, the charging process can be swapped between the left and right side of FIG. 6 thus alternating the charging of C1 and C2 between I1 and I2 on consecutive transitions (e.g., rising edges) of QDIV. That has the effect of chopping low frequency noise such as 1/f noise of the current sources and differential comparator.

Figure 8:
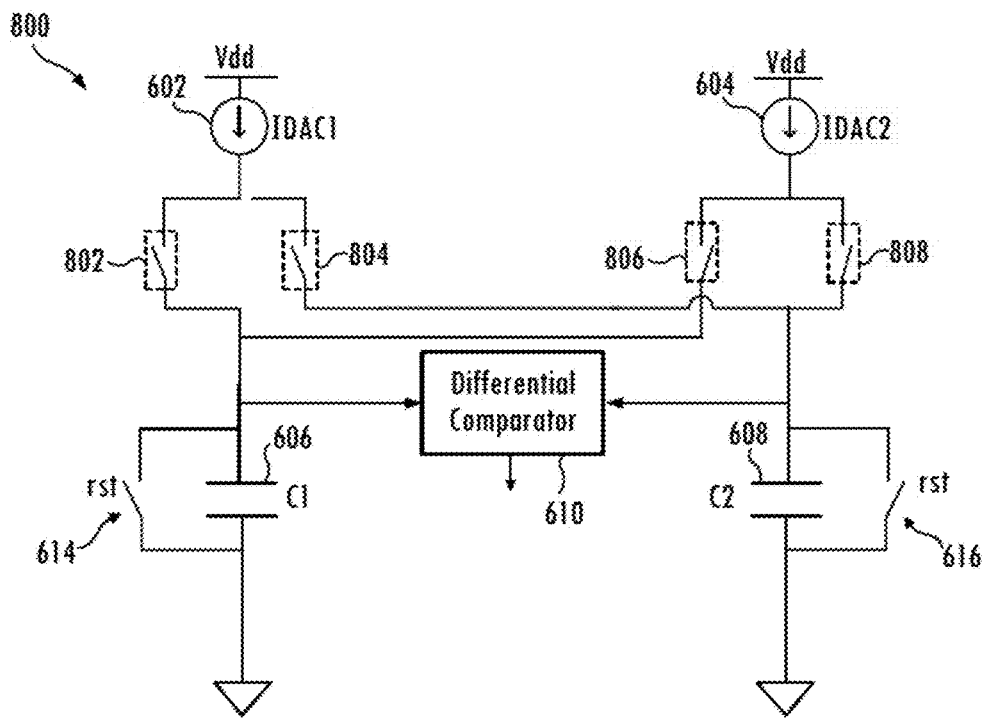
FIG. 8 illustrates an embodiment of a phase interpolator with a differential topology in which the charging process can be swapped between left and right sides.
Figure 9:
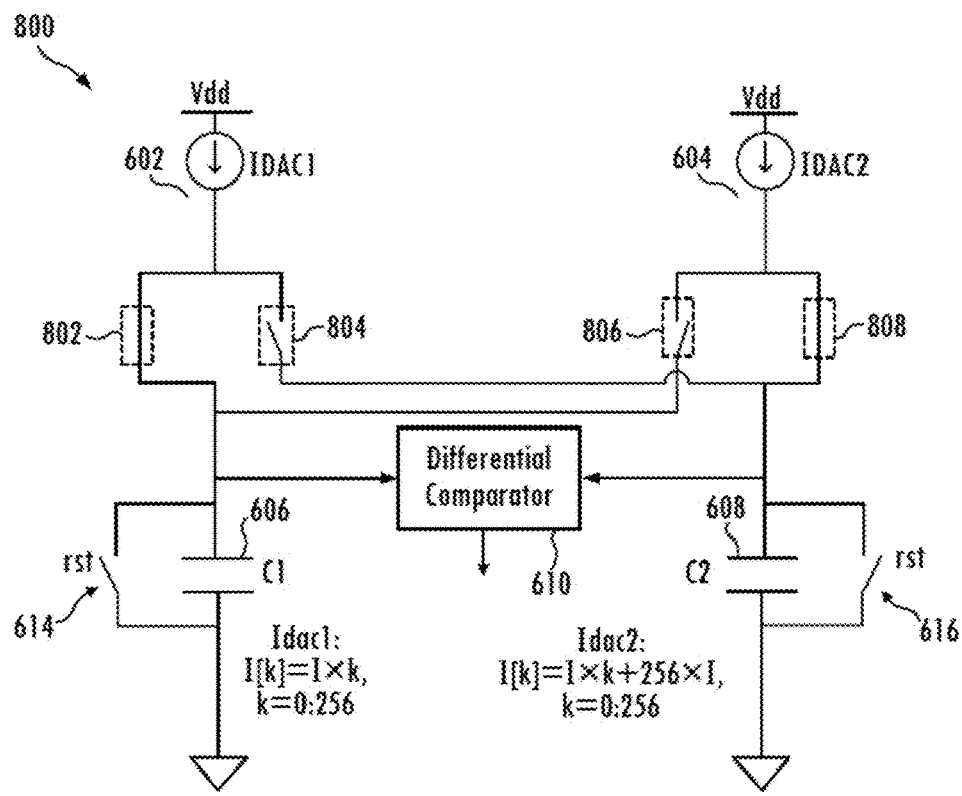
FIG. 9 illustrates first switch positions that cause the phase interpolator current digital-to-analog converter (IDAC) on the left to charge the capacitor on the left and the IDAC on the right to charge the capacitor on the right.
Figure 10:
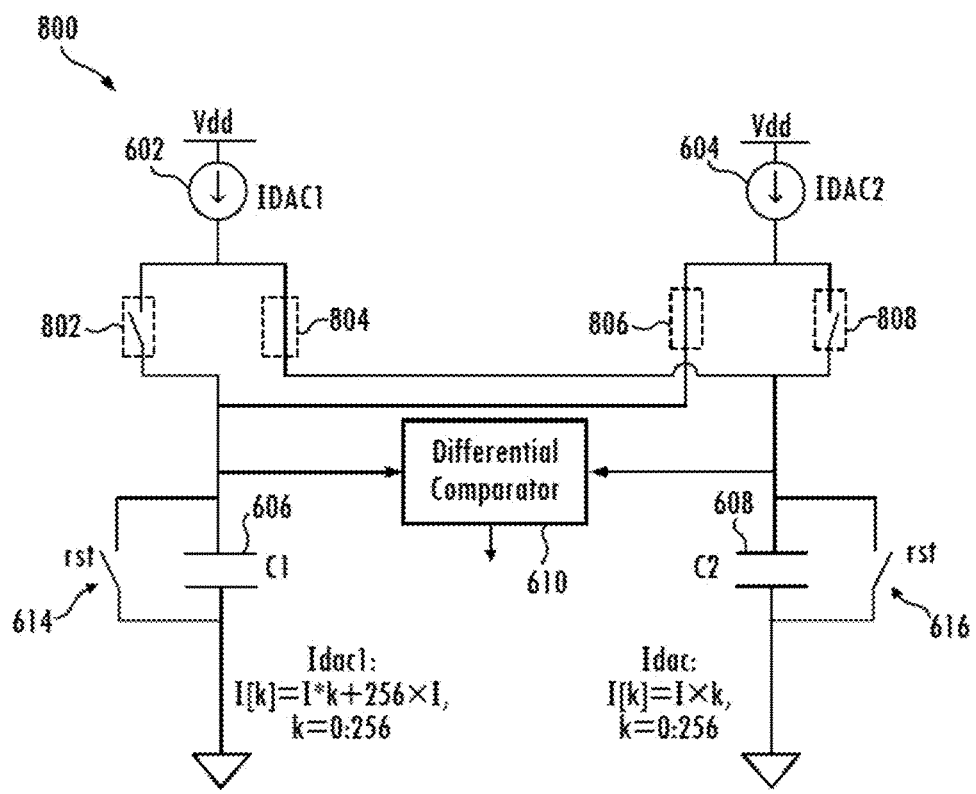
FIG. 10 illustrates second switch positions that cause the IDAC on the left to charge the capacitor on the right and the IDAC on the right to charge the capacitor on the left.

FIG. 8 illustrates a phase interpolator structure 800 that allows swapping the charging process to chop low frequency noise. The common elements with FIG. 6 have the same reference numerals. Switches 802, 804, 806, and 808 function to swap the charging process between left and right sides. FIG. 9 illustrates switches 802 and 808 closed and switches 804 and 806 open so that IDAC1 602 charges capacitor C1 606 and IDAC2 604 charges capacitor C2 608. FIG. 10 illustrates the switch setting for the next QDIV cycle with switches 804 and 806 closed and switches 802 and 808 open so that IDCAC1 602 charges C2 and IDAC2 604 charges C1. The approach illustrated in FIGS. 6-10 results in a phase interpolator structure having a symmetric differential for and thus able to achieve high levels of supply and coupling rejection without the use of excessively large area of decoupling capacitance.

Figure 11:
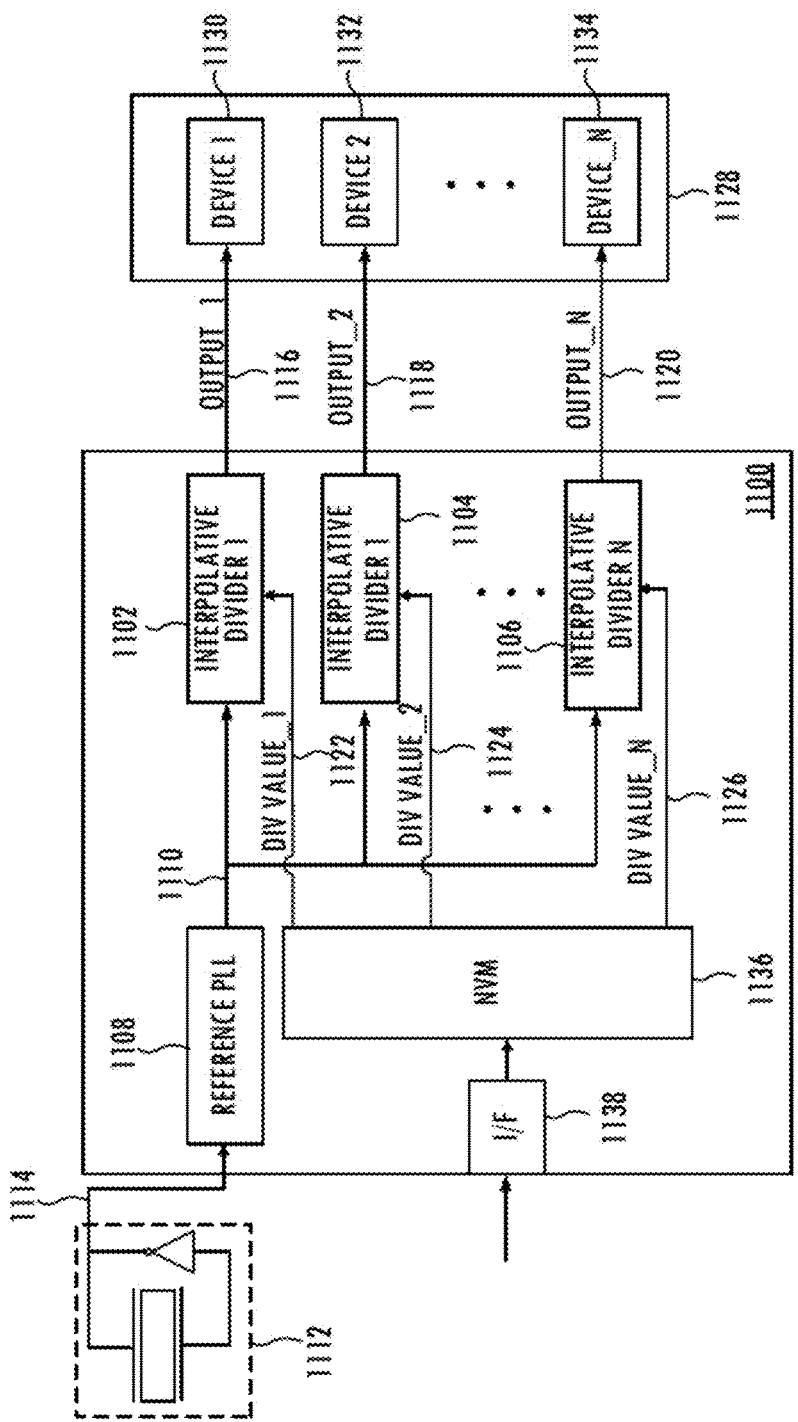
FIG. 11 illustrates a system with N interpolative dividers.

The significant reduction in the area required for decoupling capacitance allows more interpolative dividers to be placed on one integrated circuit or better performance with the same size of decoupling capacitance. FIG. 11 illustrates an embodiment with an integrated circuit 1100 having N interpolative dividers 1102, 1104, and 1106. A PLL 1108 supplies the interpolative dividers with the clock signal 1110. A crystal oscillator 1112 supplies the reference PLL 1108 with the reference clock signal 1114. The interpolative dividers supply respective output clock signals 1116, 1118, and 1120. Each output clock signal has a frequency that is independent and unrelated to the other output clock signals. The divide ratios 1122, 1124, and 1126 determine the output frequencies of the interpolative dividers. An electronic system 1128, which may be communication infrastructure (optical and/or wireless) or other systems requiring multiple independent clock frequencies, receives the clock signals with independent frequencies. The system 1128 may be a system on chip (SOC) and devices 1130, 1132, and 1134 of the system are different portions of the SOC that require the different frequencies. In other embodiments, some or all of the devices 1130, 1132, and 1134 are separate integrated circuits in system 1128 that require the clock signals supplied by integrated circuit 1100 to have separate and unrelated frequencies. In embodiments, the divide ratios 1122, 1124, and 1126 are stored in nonvolatile memory (NVM) 1136. In embodiments, the NVM is programmed using serial interface 1138, which is coupled to control logic, e.g., in system 1128 (not shown in FIG. 11).

Figure 12:
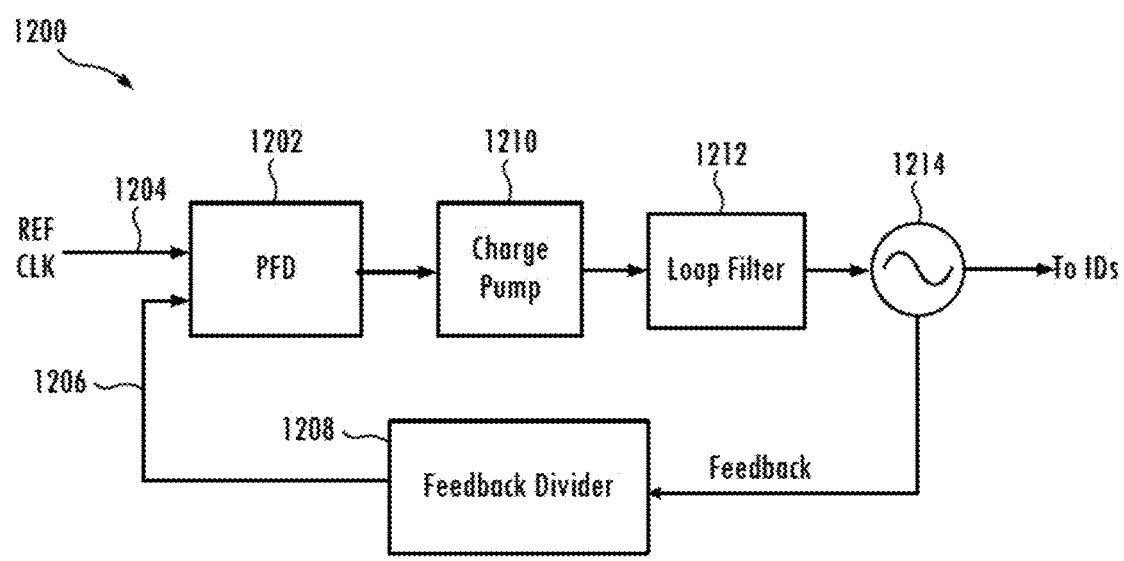
FIG. 12 illustrates an exemplary phase-locked loop (PLL) that may be used in conjunction with one or more interpolative dividers.

FIG. 12 illustrates a high-level block diagram of an exemplary PLL 1200 that may be used in conjunction with one or more interpolative divider circuits described herein. The PLL 1200 includes a phase and frequency detector 1202 coupled to receive the reference clock 1204, e.g., from a crystal oscillator, and to receive a feedback clock signal 1206 from the feedback divider 1208. A charge pump 1210 receives the phase difference between the feedback clock signal 1206 and the reference clock signal 1204 and supplies the loop filter 1212 with that phase difference. The loop filter in turn controls the voltage controlled oscillator (VCO) 1214 to reduce any errors detected by the PFD 1202. Note that various aspects of the PLL 1200 may be implemented digitally.

Thus, embodiments of a differential phase interpolator of an interpolative divider have been shown that reduce the need for decoupling capacitance. The description of the invention set forth herein is illustrative and is not intended to limit the scope of the invention as set forth in the following claims. Variations and modifications of the embodiments disclosed herein, may be made based on the description set forth herein, without departing from the scope of the invention as set forth in the following claims.

What is claimed is:

1. An interpolative clock divider circuit comprising:
   an integer divider configured to receive an input clock signal and supply a divided clock signal; and
   a phase interpolator coupled to the integer divider and configured to supply a delayed divided clock signal as an output clock signal, the phase interpolator including a first current source coupled to a first capacitor, a second current source coupled to a second capacitor, and a comparator coupled to the first capacitor and the second capacitor to compare a first voltage across the first capacitor and a second voltage across the second capacitor.

2. The interpolative clock divider circuit of claim 1 wherein a transition of the output clock signal is determined responsive to the comparator indicating that the first voltage equals the second voltage.

3. The interpolative clock divider circuit of claim 1 further comprising a divider controller coupled to provide an integer divider control signal to the integer divider and a digital quantization error to a phase interpolator that includes the first current source, the second current source, the first capacitor, the second capacitor, and the comparator.

4. The interpolative clock divider circuit of claim 3 wherein the divider controller includes a sigma delta modulator.

5. The interpolative clock divider circuit of claim 4 wherein the sigma delta modulator receives an interpolative divider divide value to cause the interpolative clock divider circuit to divide the input clock signal by the interpolative divider divide value.

6. The interpolative clock divider circuit of claim 3 wherein the first current source includes 2M unit elements, and k unit elements of the first current source are turned on during a first part of a charging cycle, where M is an integer and k is an integer less than or equal to M and greater than or equal to zero.

7. The interpolative clock divider circuit of claim 6 wherein during one charging cycle the first current source is coupled to the first capacitor and the second current source is coupled to the second capacitor and during another charging cycle the first current source is coupled to the second capacitor and the second current source is coupled to the first capacitor.

8. The interpolative, clock divider circuit of claim 6 wherein the second current source includes 2M unit elements and (k+M) unit elements are turned on during a second part of a charging cycle.

9. The interpolative clock divider circuit of claim 1 further comprising:
   a first reset circuit coupled to reset the first voltage across the first capacitor to a reset voltage; and
   a second reset circuit coupled to reset the second voltage across the second capacitor to the reset voltage.

10. A method for generating an output clock signal, the method comprising:
    receiving an input clock signal at an interpolative divider;
    dividing the input clock signal in an integer divider according to an integer divider control signal;
    supplying an output of the integer divider to a phase interpolator;
    charging a first capacitor in the phase interpolator using a first current source during a first part of a charging cycle and during a second part of the charging cycle;
    charging a second capacitor in the phase interpolator using a second current source during a second part of a charging cycle but not the first part of the charging cycle; and
    generating a transition in the output clock signal from the interpolative divider responsive to a first voltage across the first capacitor and a second voltage across the second capacitor being equal.

11. The method of claim 10 further comprising supplying an integer divide control signal to the integer divider and a digital quantization error to the phase interpolator from a sigma delta modulator.

12. The method of claim 11 further comprising supplying an interpolative divider divide ratio to the sigma delta modulator to cause the interpolative divider to divide the input clock signal by the interpolative divider divide ratio.

13. The method of claim 12 further comprising charging the first capacitor with k of M unit elements of the first current source during the first part of the charging cycle and the second part of the charging cycle, where M and k are integers and $0 \le k \le M$.

14. The method of claim 13 further comprising charging the second capacitor with (k+M) unit elements turned on in the second current source during the second part of the charging cycle.

15. The method of claim 14 determining a value of k according to the digital quantization error.

16. The method of claim 15 further comprising:
    charging the first capacitor using the first current source and charging the second capacitor with the second current source during a first charging cycle; and
    charging the first capacitor using the second current source and charging the second capacitor with the first current source during a next charging cycle.

17. The method of claim 10 further comprising:
    supplying the input clock signal to at least one additional interpolative divider; and
    supplying an additional output clock signal from the at least one additional interpolative divider with a frequency independent from a frequency of the output clock signal.

18. A clock generator system comprising:
    a first interpolative divider configured to divide an input clock signal by a first divide ratio, the first interpolative divider including a first integer divider coupled to the input clock signal, the first interpolative divider including a first phase interpolator coupled to the first integer divider to provide a first output clock signal, the first phase interpolator including a first current source coupled to a first capacitor, a second current source coupled to a second capacitor, and a first comparator coupled to the first capacitor and the second capacitor;
    a second interpolative divider to divide the input clock signal by a second divide ratio, independent of the first divide ratio, the second interpolative divider including a second integer divider coupled to the input clock signal, the second interpolative divider including a second phase interpolator coupled to the second integer divider to provide a second output clock signal, the second phase interpolator including a third current source coupled to a third capacitor, a fourth current source coupled to a fourth capacitor, and a second comparator coupled to the first capacitor and the second capacitor; and a phase-locked loop configured to supply the input clock signal.

19. The clock generator system as recited in claim 18 further comprising a crystal oscillator supplying a reference clock signal to the phase-locked loop.

20. The clock generator system as recited in claim 18 further comprising a first portion utilizing the first output clock signal and a second portion utilizing the second output clock signal and frequencies of the first output clock signal and the second output clock signal are unrelated.

* * * * *